United States Patent [19]

Nakajima

[11] Patent Number: 4,717,685
[45] Date of Patent: Jan. 5, 1988

[54] METHOD FOR PRODUCING A METAL SEMICONDUCTOR FIELD EFFECT TRANSISTOR

[75] Inventor: Shigeru Nakajima, Osaka, Japan

[73] Assignee: Sumitomo Electric Industries, Ltd., Osaka, Japan

[21] Appl. No.: 860,425

[22] Filed: May 7, 1986

[30] Foreign Application Priority Data

May 9, 1985 [JP] Japan .................................. 60-98293

[51] Int. Cl.$^4$ ........................................... H01L 21/265
[52] U.S. Cl. ........................................ 437/44; 437/26; 437/912; 437/143; 437/22; 357/15; 437/39
[58] Field of Search ..................... 29/571, 576 B, 578; 357/15, 19; 148/DIG. 84, 1.5, 186

[56] References Cited

U.S. PATENT DOCUMENTS

| 3,901,738 | 8/1975 | Hunspeger et al. | 148/1.5 |
|---|---|---|---|
| 4,295,898 | 10/1981 | Yoshida et al. | 148/1.5 |
| 4,389,768 | 6/1983 | Fowler et al. | 29/571 |

FOREIGN PATENT DOCUMENTS 0033817  4/1981  Japan .................................... 29/589

OTHER PUBLICATIONS

MOCVD GaAlAs Hetero-Buffer GaAs Low Noise MESFETs-by Ohata, et al., Japanese Journal of Applied Physics, vol. 22 (1983).
Effects of p-type Barrier Layer on Characteristics of Sub-Micron Gate Self Aligned GaAs FET-by K. Matsumoto, et al., Inst. Phys. Conf. Ser. No. 74: Chapter 7.
The Effect of Substrate Purity on Short-Channel Effects of GaAs MESFET's-Nakamura, et al.,-Extended Abstracts of the 16th '84 Int'l Conf. on Solid State Devices and Material.
Characteristics of Submicron Gate GaAs FET's with $Al_{0.3}Ga_{0.7}$ As Buffers: Effects of Interface Quality-by Kopp, et al., IEEE Electron Device Letters, vol. EDL-3, No. 2, Feb. 1982.
Below 10 ps/Gate Operation with Buried p-Layer Saint Fets by Yamasaki, et al.,-Electronics Letters, 6th Dec. 1984, vol. 20, No. 25/26.
King et al., "GaAs FETs with Si-Implanted Channel", in *Electronics Letters*, 31 Mar. 1977, vol. 13, No. 7, pp. 187–188.
Itoh et al., "Stability of Performance and Interfacial problems in GaAs MESFETs", in IEEE Trans. on Electron Devices, vol. ED-27, No. 6, Jun. 1980, pp. 1037–1044.
Tiwari S., "Improving Output Conductance of Short Channel GaAs Fets", in *IBM Tech. Disc. Bull.*, vol. 27, No. 2, Jul. 1984, p. 1351.
Ferry, D. K., et al., "Gallium Arfenite Technology, TK 7871.15 G3 G35 1985, Howard W. Sams & Co., 1985.

*Primary Examiner*—Brian E. Hearn
*Assistant Examiner*—Tuan N. Quach
*Attorney, Agent, or Firm*—Cushman, Darby & Cushman

[57] ABSTRACT

A method for producing a metal semiconductor field effect transistor includes the steps of forming a buffer layer of $Al_xGa_{(1-x)}As$ in a predetermined region of the semiconductor substrate using a mask pattern by selective Al ion implantation and annealing the semiconductor substrate including the layer. The resulting layer becomes a buffer layer of $Al_xGa_{(1-x)}As$. In a MESFET having such a buffer layer operational characteristics are improved.

3 Claims, 21 Drawing Figures

METHOD FOR PRODUCING A METAL SEMICONDUCTOR FIELD EFFECT TRANSISTOR

BACKGROUND OF THE INVENTION

1. Field of the Invention

The present invention relates to a method for producing a metal semiconductor field effect transistor, more particularly, to a method for producing a GaAs metal semiconductor field effect transistor with a short gate length.

2. Description of the Prior Art

A metal semiconductor field effect transistor (referred to as MESFET hereinafter), which is a Schottky gate type field effect transistor, may be adopted as an active element for amplifying a signal at ultra high frequency with a relatively higher gain and as an active element for a high frequency oscillating signal. It has been known to those skilled in the art that the MESFET has a superior performance compared with the other transistors when the MESFET is used as a fundamental element in an integrated circuit operated at ultra high speed. More particularly, a GaAs MESFET, whose semiconductor substrate is made of GaAs, has been a well-known device to the alternative Si device being used extensively now, since the GaAs MESFET performs in a superior manner and has a simple structure.

In general, GaAs MESFET is fabricated as follows. Firstly, a conductive semiconductor layer, which is generally called an "active layer", is formed in a GaAs substrate by implantation of impurity ions such as $Si^+$ into the GaAs substrate, In order to reduce the parasitic resistance, further impurity ions are doped in a relative high concentration in the region of the GaAs substrate adjacent to the source and the drain electrodes. Then the MESFET is annealed at a high temperature so as to activate the doped ions. Then, after a source electrode, a drain electrode, and a gate electrode are formed on the GaAs substrate, the GaAs MESFET is fabricated. Recently, with a refractory gate electrode and a dummy gate electrode, a high impurity concentration region is self-alignedly formed adjacent to the gate region, then the fabricated MESFET has improved electrical performance.

FIG. 1 shows a conventional MESFET structure which has been extensively used. As shown in FIG. 1, an active layer 22 is formed on a high resistivity semiconductor crystal substrate 21, and a Schottky gate electrode 24, an ohmic contact source electrode 27 and a drain electrode 28 of ohmic contact are respectively formed on the upper surface of the active layer 22.

The electrical characteristics of the MESFET are indicated by the following transconductance gm and cut-off frequency $f_T$.

$$gm = K(V_g - V_t) \quad (1)$$

$$f_T = gm/(2\pi Cgs) \quad (2)$$

where $$K = (Z\epsilon\mu)/(2aLg) \quad (3)$$

$V_g$ is the gate voltage.
$V_t$ is the threshold voltage of the MESFET.
Cgs is the capacitance between the gate electrode 27 and the source electrode 28.
$\epsilon$ is the dielectric constant of the semiconductor substrate 21.
$\mu$ is the mobility of the carrier.
a is the thickness of the active layer 23.
Lg is the gate length.
Z is the gate width.

With greater transconductance of the MESFET, the MESFET has higher current amplification and can drive a greater capacitive load at a high speed. Moreover, with a higher cut-off frequency $f_T$, the MESFET can switch at a higher speed. That is, with greater transconductance gm and higher cut-off frequency, the resulting MESFET performs better.

In order to increase the transconductance gm, gate length Lg of the MESFET is shortened, then the smaller capacitance Cgs between the gate electrode and the source electrode is obtained, therefore, the higher cut-off frequency is obtained. From this viewpoint, there has been an attempt to improve MESFET performance by decreasing the gate length Lg. However, the MESFET with the shorter gate length Lg causes short-channel effects which harm the performance of the GaAs MESFET, wherein the short-channel effects are the problems that the transconductance gm cannot increase as expected, the threshold voltage of the MESFET varies to the positive side, and the current cut-off characteristic is inferior. More particularly, the short-channel effects occur in the self-aligned MESFET whose high impurity concentration region is adjacent to the gate region.

The short-channel effects are said to be caused by a substrate leakage current between the high impurity concentration regions formed at both sides of the gate region through the semiconductor substrate. As described above, in order to obtain a higher performance of the MESFET, it is necessary to shorten the gate length Lg and suppress the aforementioned short-channel effects.

In order to suppress the short-channel effects, a method was suggested which forms a p-type layer 29 with an opposite polarity to the n-type active layer 23, in the region between the active layer 23 and the semi-insulating semiconductor substrate 21 as shown in FIG. 2. The known methods of forming the p-type layer 29 are as follows:

(a) An Mg ion implantation method as described in "Submicron-gate self-aligned GaAs FET with p-type barrier layer fabricated by ion implantation", IEEE the 42nd Annual Device Research Conference, Santa Barbara, CA, paper V1B-5, 1984 by K. Matsumoto et al.

(b) A C and O ions implantation method as described in "The effect of substrate purity on short-channel effects of GaAs MESFET's", IEEE Proceedings of the 16th Conference Solid State Devices and materials (Kobe), pp. 395–398, 1984 by H. Nakamura et al.

(c) A Be ion implantation method as described in "Below 10 ps/gate operation with buried p-layer SAINT FET's", Electron Letters, vol. 20, no. 25/26, pp. 1029–1031, 1984 by K. Yamasaki et al.

In the above methods, a pn junction is formed between a p-type layer and a n-type layer, and the potential barrier formed by the pn junction can suppress the aforementioned substrate leakage current.

In addition, another method for suppressing the substrate leakage current was suggested as shown in FIG. 3. In the method, a buffer layer 30 is formed between the active layer 22 and the semi-insulating semiconductor substrate 21, wherein the buffer layer 30 is made of a semiconductor such as $Al_{0.3}Ga_{0.7}As$ with a small electron affinity and a wider forbidden energy band than those made of GaAs. In the MESFET with the buffer layer 30, the difference of the electron affinity between the n-type GaAs active layer 22 and the $Al_{0.3}Ga_{0.7}As$ buffer layer 30 causes a potential barrier which is a discontinuous portion of conduction band as shown in FIG. 6(A), electrons are confined in the GaAs active layer 22 by the potential barrier. Thus, the substrate leakage current can be suppressed.

In order to form buffer layer 30 an $Al_{0.3}Ga_{0.7}As$ buffer layer is first formed in a GaAs substrate 21 by an epitaxial growth method such as molecular beam epitaxial growth, or metal organic chemical vapor epitaxial growth etc., a GaAs active layer 22 is formed above the $Al_{0.3}Ga_{0.7}As$ buffer layer 30. The MESFET with a buffer layer formed by molecular beam epitaxial growth method was described in "Characteristics of Submicron Gate GaAs FET's With $Al_{0.3}Ga_{0.7}As$ Buffers: Effects of Interface Quality", IEEE Electron Device Letters, Vol. EDL-3, No. 2, 1982 by W. Kopp et al., on the other hand, the MESFET with a buffer layer formed by the metal organic chemical epitaxial growth method was described in IEEE Proceedings of the 14th Conference on Solid State Devices, Tokyo, 1982 by K. Ohata et al.

The aforementioned p-type layer formation can effectively suppress the substrate leakage current which mainly causes the short-channel effect; however, the p-type layer which is not completely depleted may increase the parasitic capacitance. As a result, the p-type layer may reduce the high speed characteristic of the MESFET. Therefore, it is necessary to form the p-type layer by correctly controlling the profile of the p-type layer, that is, precisely controlling the ion implantation. Even if the p-type layer with an ideal ion profile is formed by precisely controlling implantation, a difficult problem relating to the precise control of the profile of the p-type layer during the annealing process results since it unknown how the thermal diffusion activates the impurity ion during the annealing process.

The p-type layer formation increases the dose of the impurity ion and increases the impurity scattering effect to the electron in the active layer, thereby the electron mobility in the active layer decreases. As a result, there may be a problem that the gradient of the rising part in the static voltage-current characteristic of the MESFET becomes small due to electron mobility in the active layer.

On the other hand, the AlGaAs buffer layer formation can effectively suppress the substrate leakage current as well as the p-type layer formation. $Al_xGa_{(1-x)}As$ is mixed crystal semiconductor of AlAs and GaAs, various material constants, such as lattice constant, forbidden energy band, and electron affinity etc. can be changed by changing the mole fraction of the mixed crystal semiconductor. In the MESFET with a hetero junction of $Al_xGa_{(1-x)}As$ and GaAs, an ideal hetero interface can be obtained almost without lattice mismatching, since the lattice constant of AlAs is almost similar to the lattice constant of GaAs, wherein the lattice constant of GaAs is 5.65 Å, whereas the lattice constant of AlAs is 5.66 Å. Therefore, the MESFET with the ideal hetero interface has the advantage that an increment of the electron scattering due to lattice mismatching can be prevented.

It is necessary to control the thickness of the active layer precisely which is formed by the epitaxial growth method, because the threshold voltage of a GaAs MESFET depends on the thickness of the active layer. In addition, in order to form a number of MESFETS with a constant threshold voltage for use in integrated circuits, it is necessary to form the active layer with a uniform thickness over the whole area of a wafer with a large diameter such as 2 inches. However, it is impossible to form the active layer with a uniform thickness over the whole area of a wafer by the teaching of the prior art. This difficulty is an obstacle in the manufacturing of a number of MESFETs having a uniform active layer using an integrated circuit technique.

A further difficulty inherent in the prior art MESFETS is that only one sort of threshold voltage can be obtained in the MESFET with the active layer formed by the conventional epitaxial growth method, for example, only depletion type MESFETs can be provided on one common substate. Therefore, there may be restriction in circuit construction and the problem arises that it is necessary to form a separation between two adjacent elements.

In the aforementioned epitaxial growth method, not only is the apparatus very large, but also the production process is very complex, and the throughout is very slow. Therefore, the cost and performance of the MESFET depends on the epitaxial growth process.

Moreover, in an integrated circuit comprising a GaAs MESFET, Direct coupled FET logic, which is called "DCFL" below, has been a noticeable device, since the integration density is higher and also the dissipation power is smaller as compared to another sort of logic circuit. However, the logic swing of the DCFL is limited by the Schottky barrier height of the GaAs MESFET. For example, the logic swing of the conventional DCFL is only 0.6 V, therefore, the conventional DCFL has a disadvantage that the conventional DCFL becomes unstable by the dispersion of the threshold voltage. As a result, a large scale integrated circuit with the DCFLs can not be made.

In order to obtain a larger logic swing than the DCFL, a few improvements have been developed by circuit techniques such as buffered FET logic and source coupled FET logic. These logic circuits have the disadvantages that the dissipation power is high and the number of elements are necessary for fabricating a gate circuit than that of the aforementioned DCFL. Therefore, it is difficult to provide a large scale integrated circuit comprising buffered FET logic, or source couple FET logic.

Moreover, recently, it has been suggested that a thin active layer with a high impurity concentration is used in order to increase a transconductance gm of the MESFET, however, the thin active layer with a higher impurity concentration leads to an inferior Schottky characteristic since the gate leakage current increases.

SUMMARY OF THE INVENTION

An essential object of the present invention is to provide a method for producing MESFETs in which a buffer layer is provided and can improve various operational characteristics of the MESFET and can be easily provided at a precise level in a substrate.

Another object of the present invention is to provide a method for producing MESFETs which is suitable for fabricating short length MESFETs in the form of a large scale integrated circuit and suppressing short-channel effects.

A further object of the present invention is to provide a MESFET having a buffer layer formed at a precise position in the MESFET so as to effectively improve the operational characteristics of the resulting MESFETs.

A still further object of the present invention is to provide a MESFET which can suppress short-channel effects of the MESFET.

A still further object of the present invention is to provide a MESFET which has a higher Schottky barrier height and a lower gate leakage current.

According to the present invention, there is provided a method for producing a MESFET comprising steps of, forming a first mask pattern made of at least one material of resist, $SiO_2$, Ti, W, Mo, or Ni on one portion of an upper surface of a semiconductor substrate of GaAs, forming a first layer which will be a buffer layer of $Al_xGa_{(1-x)}As$ in a predetermined region of the semiconductor substrate using said first mask pattern by selective Al ion implantation, forming a second layer for an active layer of GaAs in a predetermined region of the semiconductor substrate using the said first mask pattern by selective ion implantation, removing the first mask pattern, forming a gate electrode of a metal on the upper surface of the semi-insulating semiconductor substrate, wherein the metal is made of a material connectable with GaAs by Schottky contact, forming a second mask pattern made of at least one material of resist, $SiO_2$, Ti, W, Mo, or Ni on one portion of an upper surface of a semiconductor substrate of GaAs, forming regions for high impurity concentration regions in predetermined regions at both sides of the said gate electrode in the semiconductor substrate using the second mask pattern by ion implantation, removing the second mask pattern, annealing the semiconductor substrate including the first and the said second layers and regions, whereby the said first and the said second layers become the buffer layer of $Al_xGa_{(1-x)}As$ and the active layer of GaAs, respectively, and also the regions become the high impurity concentration regions, and forming a source electrode and a drain electrode on the upper surface of the high impurity concentration regions, respectively.

In the method mentioned above, the position and thickness of the buffer layer of $Al_xGa_{(1-x)}As$ and the active layer of GaAs can be more precisely controlled by selective ion implantation than the conventional epitaxial growth method and a MESFET with less dispersion in threshold voltage can be obtained. Two types of MESFET enhancement type and depletion type MESFETs, can be formed on the same wafer by selectively controlling the dose of impurity ions. Thus, the method of producing the MESFET is suitable for producing a large scale integrated circuit.

Furthermore, the formation of a buffer layer of $Al_xGa_{(1-x)}As$ under the active layer GaAs can suppress short-channel effects.

Moreover, the formation of a buffer layer $Al_xGa_{(1-x)}As$ above the active layer GaAs can yield a higher gate barrier height and a lower gate leakage current of the MESFET than the conventional MESFET without the buffer layer. The result is an improved Schottky characteristic.

DESCRIPTION OF THE PREFERRED EMBODIMENTS

First Embodiment

Referring to FIGS. 4(A) through 4(H), a process for producing a first preferred embodiment of a MESFET according to the present invention will be described below, wherein the MESFET has a buffer layer 2 formed between an active layer 3 and a semiconductor substrate 1.

Figure 1:
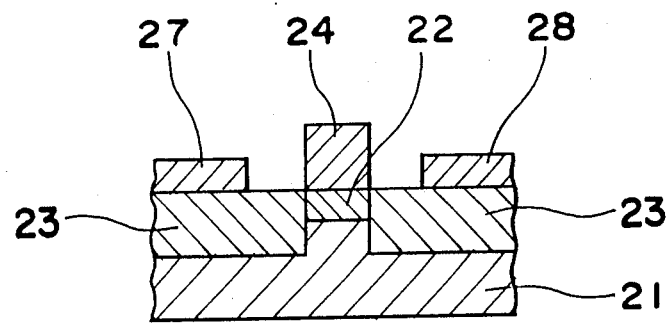
FIG. 1 is a cross sectional view of a first conventional MESFET.
Figure 2:
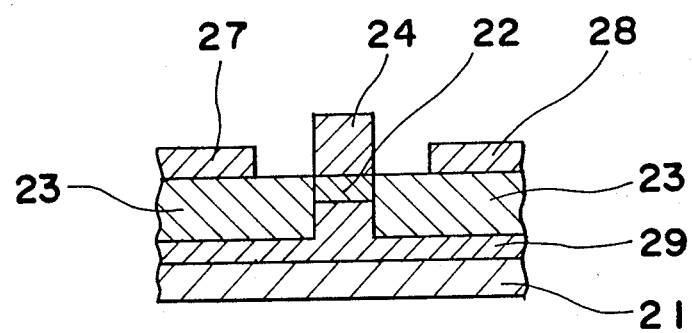
FIG. 2 is a cross sectional view of a second conventional MESFET with a p-type layer.
Figure 3:
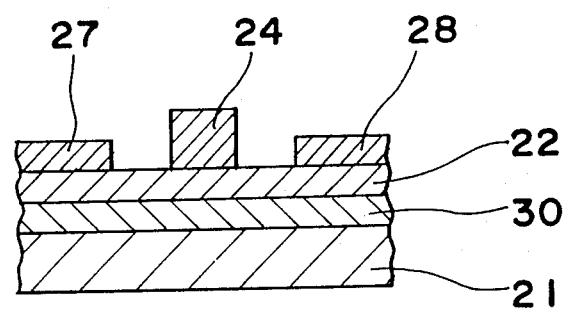
FIG. 3 is a cross sectional view of a third conventional MESFET with a buffer layer formed by an epitaxial growth method.
Figure 4A:
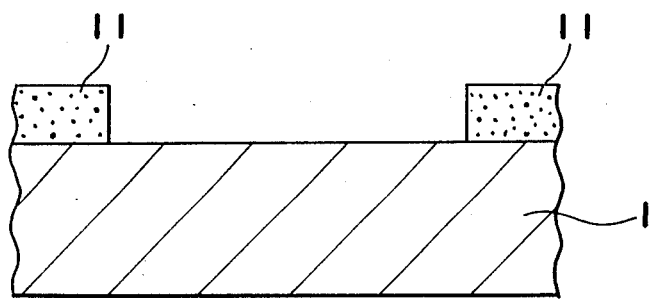
FIGS. 4(A) through 4(H) are cross sectional views showing a production process of a first preferred embodiment of a MESFET with a buffer layer formed under an active layer according to the present invention.
Figure 4B:
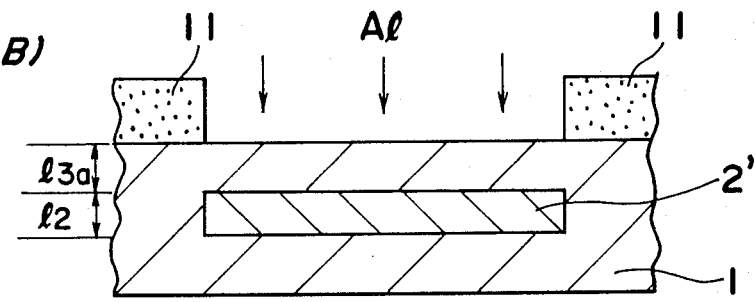
Figure 4C:
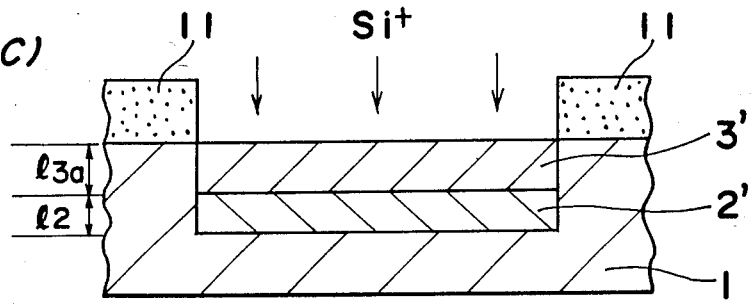

First, a resist mask pattern 11 is deposited on an upper surface of a semiconductor substrate 1 made of GaAs, except for an area where a MESFET will be formed, by a photolithography method, as shown in FIG. 4(A). Next, Al ions are implanted in the substrate 1 through the mask pattern 11 as shown in FIG. 4(B), to develop an ion implanted layer 2' with a predetermined thickness 12 which acts as a buffer layer 2 later in a predetermined depth 13a from the upper surface of the semiconductor substrate 1. The dose of the ion implantation is $2 \times 10^{16}$ cm$^{-2}$ and the acceleration energy is 200 keV, and the predetermined depth 13a corresponds to the thickness of the active layer 3 formed later. Subsequently, Si+ ions are implanted into the substrate 1 from above through the mask pattern 11 to develop a layer 3' with a predetermined depth 13a as shown in FIG. 4(C) between the upper surface of the semiconductor substrate 1 and the layer 2'. The dose of the Si+ ions is $2 \times 10^{12}$ cm$^{-2}$ and the acceleration energy is 60 keV. Moreover, the mask pattern 11 is ashed by using $O_2$ plasma.

Figure 4D:
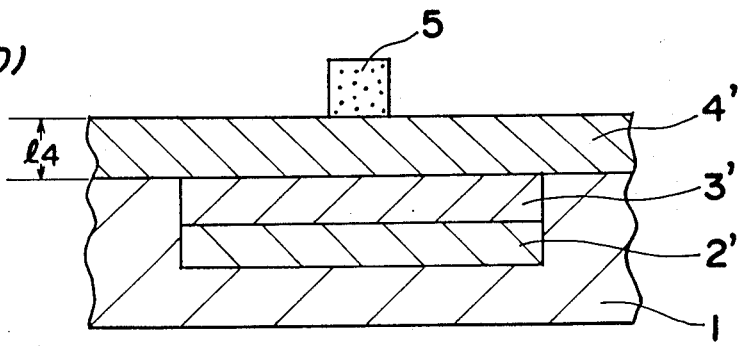
Figure 4:
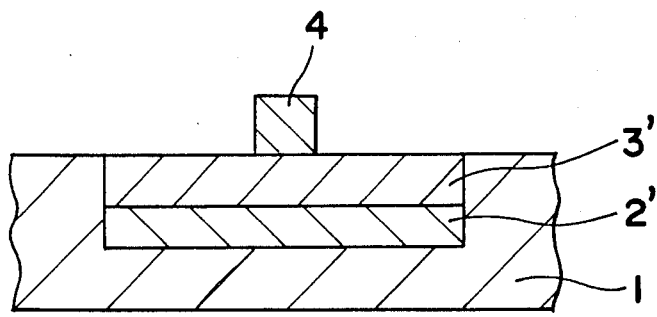
Figure 4:
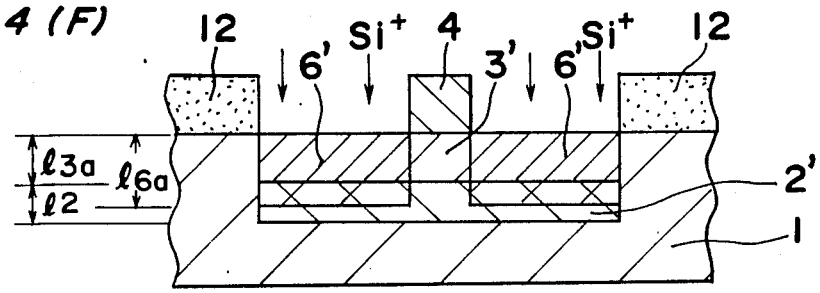
Figure 4:
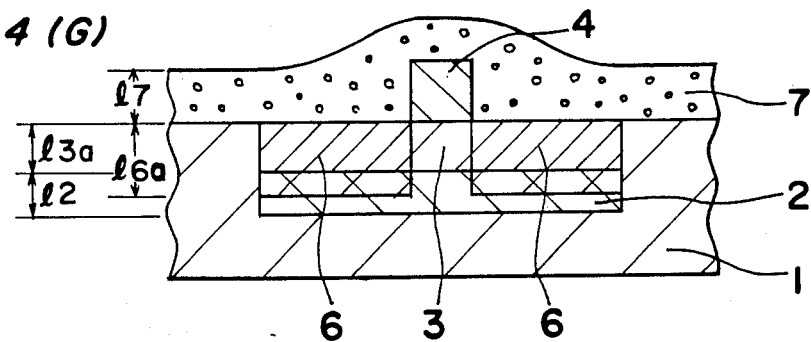
Figure 4:
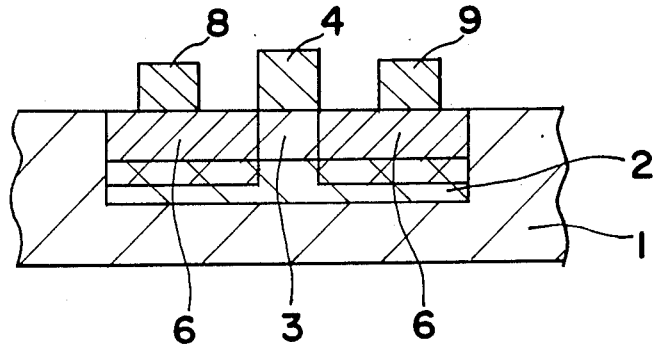

As shown in FIG. 4(D), after a refractory Schottky contact electrode layer 4' such as WSi with a thickness 14 of approximately 5000 Å using metallic material is formed on the whole upper surface of the semiconductor substrate 1 and above the layer 3' by a known method, a resist mask pattern 5 is formed by photolithography method on one portion of the upper surface of the contact electrode layer 4' at a position above a region where a Schottky gate electrode 4 is formed later. Then, as shown in FIG. 4(E), the Schottky gate electrode 4 is formed by etching the unnecessary parts of the electrode layer 4' using the resist mask pattern 5 by a reactive ion etching method. Thereafter, as shown in FIG. 4(F), after a resist mask pattern 12 is deposited on the upper surface of the semiconductor substrate 1 (except for a surface area of the MESFET), by photolithography Si+ ions are implanted from above into the layers 3' using the mask pattern 12 and the Schottky gate electrode 4 so that layers 6' with a predetermined thickness 16a are formed at both sides of the layers 3' below the Schottky gate electrode 4 for providing high impurity concentration layers 6 which will be described later. In preferred embodiments, the Si+ ions are implanted at a dose of $4.0 \times 10^{13}$ cm$^{-2}$ and at an acceleration energy of 150 keV. The thickness 16a of the Si+ ion implanted layer 6' may be larger than the thickness 13a and smaller than the thickness (13a+12). In other words, the Si+ ion implanted layers 6' may be formed up to the upper half region of the layer 2'. Afterwards, the resist mask pattern 12 is ashed by using O$_2$ plasma.

Subsequently, as shown in FIG. 4(G), a protective film layer 7 such as SiN film with a predetermined thickness 17 of approximately 1200 Å is deposited on the upper surface of the semiconductor substrate 1 and on the gate electrode 4 by plasma CVD method. Thereafter, an activation annealing is performed in an atmosphere of N$_2$ gas at 800° C. for 20 minutes. Thereby, the implanted Si+ impurity ions are activated, resulting in the layer 3' becoming the GaAs active layer 3 and layers 6' becoming the high impurity concentration region layers 6. Also, the Al ion implanted layer 2' is crystallized result, the buffer layer 2 (mode of Al$_x$Ga$_{(1-x)}$As) is formed under the GaAs active layer 3 and between both of the high impurity concentration region layers 6. Thereafter, the protective film layer 7 is removed.

Finally, after a resist mask pattern (not shown) is deposited by a photolithography method on the upper surface of the semiconductor substrate 1 (except for the surface area of the source and drain electrodes 8 and 9) a metal material such as AuGe which is connectable with GaAs by ohmic contact is deposited on the upper surface of the semiconductor substrate 1 using the resist mask pattern as the mask by a known prior method. Subsequently, the unnecessary metal material is removed by lift-off method. Then, the remaining metal material is alloyed by sintering at 400° C. for approximately 5 minutes. Thereby the source and the drain electrodes 8 and 9 are formed on the required upper surface of the semiconductor substrate 1, resulting in fabricating the MESFET with the Al$_x$Ga$_{(1-x)}$As buffer layer 2 situated below the active layer 3, as shown in FIG. 4(H).

In the aforementioned production process according to the first preferred embodiment of the MESFET the step relating to selective Al ion implantation need not be performed after forming the resist mask pattern 11 and before the Si+ ion implantation for forming the layer 3', the step of selective Al ion implantation may be performed before the annealing step shown in FIG. 4(G), and after the Si+ ion implantation for forming the layer 3' (which will be the active layer 3 shown in FIG. 4(C), or after the Si+ ion implantation for forming the layers 6' (which will be the high impurity concentration region layers 6 shown in FIG. 4(F)).

In the forming of the mask patterns 11 and 12, a resist is used as the mask pattern, however, other material such as SiO$_2$, Ti, W, Mo, or Ni may be used.

In Al ion implantation, the value x can be changed by changing the dose of the Al ion. Thereby, the MESFET with a buffer layer of Al$_x$Ga$_{(1-x)}$As can be fabricated. The value x may preferably be in the range of 0.2 to 0.5, and the value may more preferably be 0.3.

In the steps of forming the layers 3' and 6', Si+ is used as the impurity ion; however other impurity ions may be used.

Figure 6:
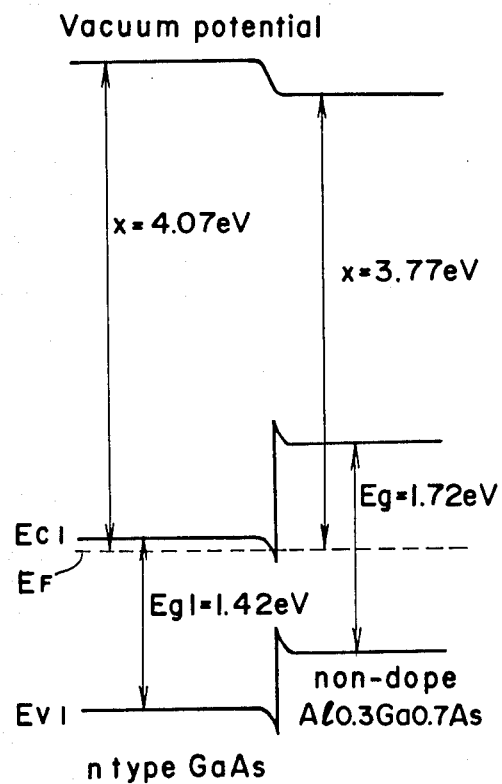
FIG. 6(A) is a schematic potential diagram of a MESFET comprising a n-type GaAs active layer and an $Al_{0.3}Ga_{0.7}As$ buffer layer, showing a potential barrier at the hetero interface between the active layer and the buffer layer and the carrier confine effect.
FIG. 6(B) is a schematic potential diagram of a MESFET comprising a p-type GaAs active layer and an $Al_{0.3}Ga_{0.7}As$ buffer layer, showing a potential barrier at the hetero interface between the active layer and the buffer layer and the carrier confine effect.
Figure 6:
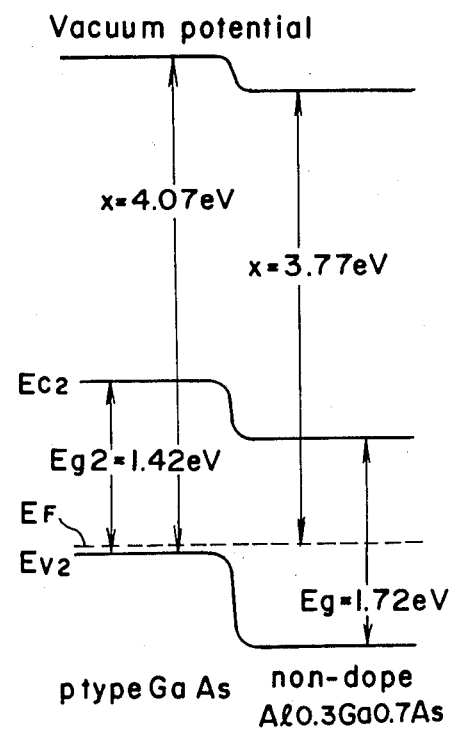

FIG. 6(A) and FIG. 6(B) show the potential barrier at the hetero interface between the n-type and the p-type GaAs layers and the Al$_{0.3}$Ga$_{0.7}$As buffer layer and the carrier confine effect. In FIGS. 6(A) and 6(B), Ec1 and Ec2 are the lowest potential of the conduction band, Ev1 and Ev2 are the lowest potential of valence band, therefore, the potential difference Eg1 between Ec1 and Ev1 and the potential difference Eg2 between Ec2 and Ev2 are the widths of the forbidden energy band. E$_F$ denotes the Fermi energy and x denotes the electron affinity.

In the fabricated MESFET with the n-type GaAs active layer 3 and the Al$_x$Ga$_{(1-x)}$As buffer layer 2, as shown in FIG. 6(A), carrier in the n-type GaAs active layer 3 cannot go to the GaAs semiconductor substrate 1 since the potential barrier is formed between the n-type GaAs active layer 3 and the Al$_x$Ga$_{(1-x)}$As buffer layer 2. Thus, the carrier is confined in the n-type GaAs active layer 3.

On the other hand, up to now n-type active layer having greater electron mobility has been generally used as an active layer of GaAs MESFETs, however, GaAs MESFET comprising a p-type active layer have been investigated according to an aspect of C-MOS of Si recently, in the future, C-MESFET of GaAs may be used. In the fabricated MESFET with the p-type active layer 3 and the Al$_x$Ga$_{(1-x)}$As buffer layer 2, as shown in FIG. 6(B), carrier in the p-type GaAs active layer 3 cannot go to the GaAs semiconductor substrate 1 since the potential barrier is formed between the p-type GaAs active layer 3 and the Al$_x$Ga$_{(1-x)}$As buffer layer 2, carrier is confined in the p-type GaAs active layer 3.

The aforementioned carrier confine effect can suppress the aforementioned short-channel effects, and the fabricated MESFET with the buffer layer 2 has a greater transconductance gm and a higher cut-off frequency f$_T$ than the conventional MESFET without the buffer layer 2.

Moreover, impurity scattering which is a problem when p-type layer is formed is now not a problem, since Al is a neutral type impurity in GaAs. It is said that impurity hardening occurs and dislocation (etch pit) density decreases by Al implantation when GaAs bulk-crystallizes, the annealing process leads to reducing the dislocation (etch pit) density, thereby dispersion of the threshold voltage may be reduced.

Second Embodiment

Referring to FIGS. 5(A) through 5(H), a production process of a second preferred embodiment of a MESFET according to the present invention will be described below, wherein the MESFET has a buffer layer 10 formed between an active layer 3 and an upper surface of a semiconductor substrate 1.

The layer which serves as the Al$_x$Ga$_{(1-x)}$As buffer layer can be formed in a region near the upper surface of the semiconductor substrate 1 by selective Al ion implantation at a reduced acceleration energy as compared with the acceleration energy as compared the first preferred embodiment of the MESFET. That is, the distance of the Al ion implantation at an acceleration energy of 20 keV can be approximately 250 Å, therefore, the buffer layer can be formed by ion implantation at the smaller acceleration energy. Moreover, the buffer layer can be formed in a region nearer the upper surface of the semiconductor substrate 1 than the aforementioned region by ion implantation through a proper insulating film layer such as SiN film layer.

Figure 5A:
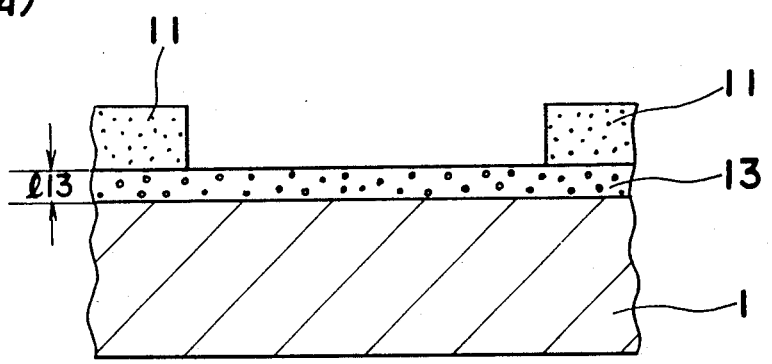
FIGS. 5(A) through 5(H) are cross sectional views showing a production process of a second preferred embodiment of a MESFET with a buffer layer formed above an active layer according to the present invention.
Figure 5B:
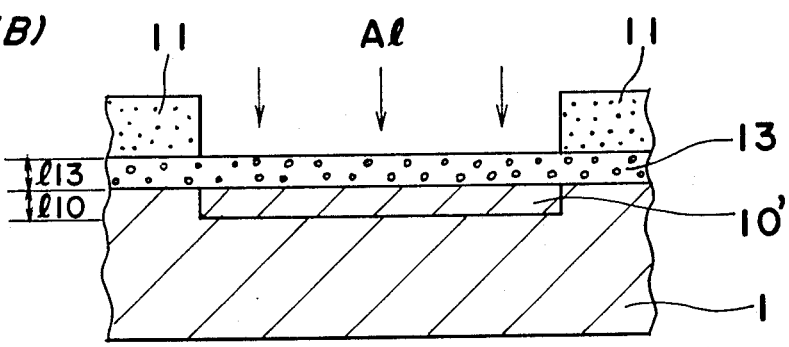
Figure 5C:
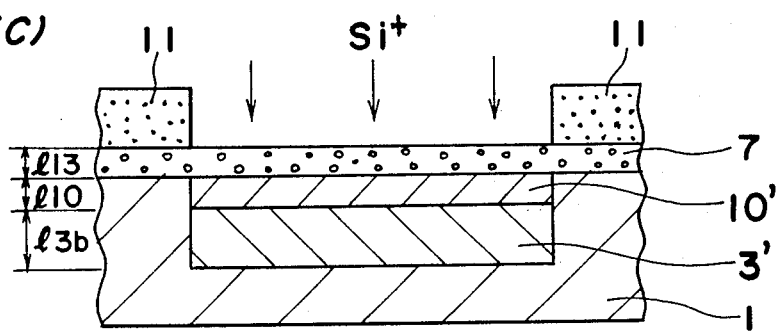

First of all, as shown in FIG. 5(A), after an insulating film layer 13 with a predetermined thickness 113 of approximately 1000 Å (such as SiN film) is formed on a whole upper surface of a semiconductor substrate 1 made of GaAs, a resist mask pattern 11 is deposited on one portion of the upper surface of the insulating film layer 13 positioned above a region where a MESFET will not be formed (by a photolithography method). Next, as shown in FIG. 5(B), a layer 10′ with a predetermined thickness 110 which will be the buffer layer 10 later is formed in a region of the semi-insulating semiconductor substrate 1 under the upper surface of the semiconductor substrate 1 by selective Al ion implantation using the resist mask pattern 11 at a dose of $8 \times 10^{16}$ cm$^{-2}$ and an acceleration energy of 30 keV through the insulating film layer 13. Then, as shown in FIG. 5(C), a layer 3′ with a predetermined thickness 13b which will be the active layer 3 is formed under the layer 10′ by selective Si+ ion implantation using the resist mask pattern 11 at a dose of $8 \times 10^{12}$ cm$^{-2}$ and an acceleration energy of 60 keV. Moreover, the mask pattern 11 is ashed by using O$_2$ plasma and the insulating film layer 13 is removed by using buffered HF.

Figure 5D:
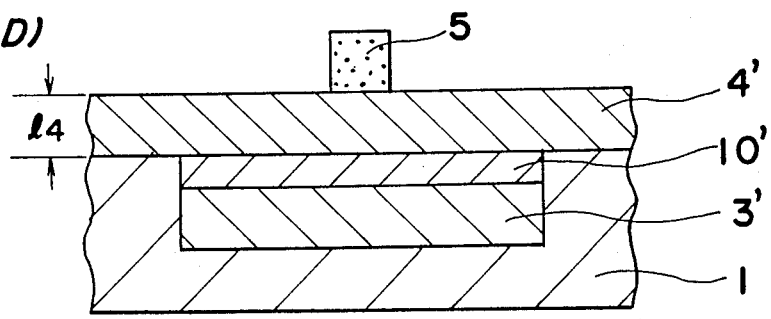
Figure 5E:
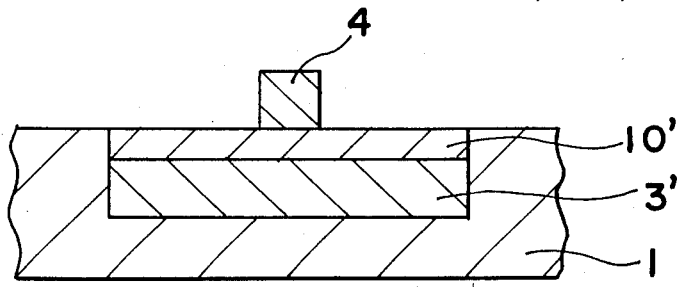
Figure 5F:
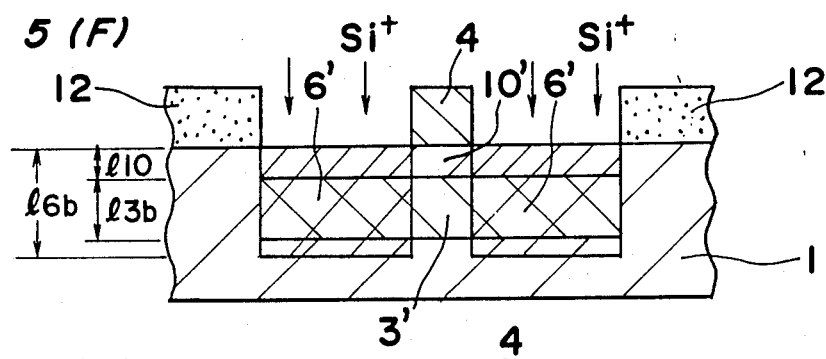

Then, as shown in FIG. 5(D), after a refractory Schottky contact electrode material 4′ with a thickness 14 of approximately 5000 Å made of WSi is formed on the whole upper surface of the semiconductor substrate 1 and above the layer 10′ by a known method, a resist mask pattern 5 is formed on one portion of the upper surface of the metal material 4′ positioned above a region where a gate electrode 4 will be formed later by photolithography method. Then, as shown in FIG. 5(E), the Schottky gate electrode 4 is formed by etching the unnecessary electrode material 4′ using the resist mask pattern 5 by reactive ion etching method. Furthermore, as shown in FIG. 5(F), after a resist mask pattern 12 is deposited on the upper surface of the semiconductor substrate 1, except for where the surface area where the MESFET is formed by a photolithography method, layers 6′ with a predetermined thickness 16b which (will be high impurity concentration region layers 6) are formed at both sides of layer 3′ (which will be the active layer 3) and under the upper surface of the semi-insulating semiconductor substrate 1 by Si+ ion implantation using the resist mask pattern 12 and the gate electrode 4 as a mask at a dose of $4.0 \times 10^{13}$ cm$^{-2}$ and an acceleration energy of 150 keV. The the thickness 16b is longer than the thickness (110+13b). Then, the resist mask pattern 12 is ashed by using O$_2$ plasma.

Figure 5G:
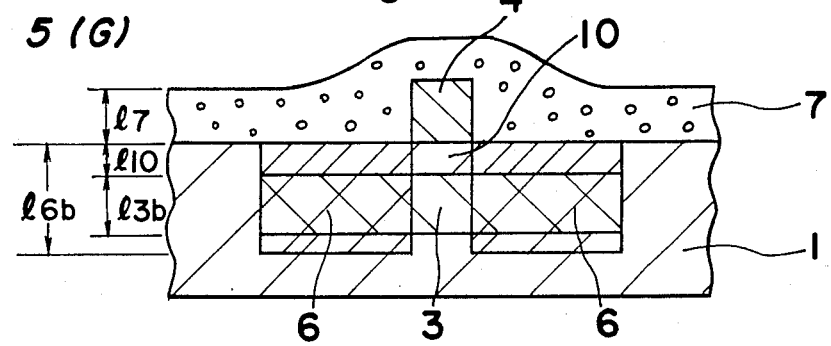

As shown in FIG. 5(G), after a protective film layer 7 with a predetermined thickness 17 of approximately 1200 Å such as SiN film is deposited on the upper surface of the semiconductor substrate 1 and on the gate electrode 4 by plasma CVD method, an activation annealing is performed in N$_2$ gas at 800° C. for 20 minutes, thereby the implanted Si+ impurity ions are activated, the layers 3′ and 6′ become the GaAs active layer 3 and the high impurity concentration region layers 6, respectively, and also the Al implanted layer 10′ are crystallized, as a result, the buffer layer 10 mode of Al$_x$Ga$_{(1-x)}$)As is formed under the gate electrode 4 and between both of the high impurity concentration region layers 6. Then, the protective film layer 7 is removed.

Figure 5H:
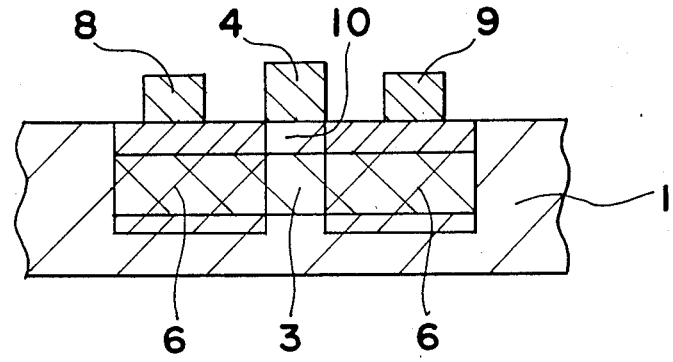

Finally, after a resist mask pattern (not shown) is deposited on the upper surface of the semiconductor substrate 1, except for a surface area where the source and the drain electrodes 8 and 9 will be formed later, by a photolithography method, a metal material which is connected with GaAs by ohmic contact such as AuGe etc. is deposited on the upper surface of the semiconductor substrate 1 using the resist mask pattern as the mask by a known method. The unnecessary metal material which will not be the source and the drain electrodes 8 and 9 is removed by a lift-off method. Then, the remaining metal material is alloyed by sintering at 400° C. for approximately 5 minutes. Thereby, the source and the drain electrodes 8 and 9 are formed on the required upper surface of the semi-insulating semiconductor substrate 1 resulting in fabricating the MESFET with the Al$_x$Ga$_{(1-x)}$As buffer layer 10 as shown in FIG. 5(H).

In the above-described production process according to the second preferred embodiment of the MESFET the selective Al ion implantation need not be performed after forming the resist mask pattern 11 and before the Si+ ion implantation for forming the layer 3′. The selective Al ion implantation may be performed after the Si+ ion implantation by forming the layer 3′ which will be the active layer 3 shown in FIG. 5(C) and before the gate electrode formation step shown in FIG. 5(D).

In forming the mask patterns 11 and 12 a resist is used as mask pattern, however, the other material such as SiO$_2$, Ti, W, Mo, or Ni may be used.

In the Al ion implantation, the value x can be changed by changing the dose of the Al ion, thereby the MESFET with the buffer layer of Al$_x$Ga$_{(1-x)}$As can be fabricated. The value x may preferably be in the range of 0.2 to 0.5, and the value x may more preferably be 0.3.

In forming the layers 3′ and 6′, Si+ is used as the impurity ion, however, other impurity ions may be used.

In the fabricated MESFET with the Al$_x$Ga$_{(1-x)}$As buffer layer 10 formed between the gate electrode 4 and the GaAs active layer 3, the gate potential barrier is higher than the conventional MESFET without the buffer layer 10. Therefore, in the DCFL comprising the fabricated MESFET with the buffer layer 10, a higher logic swing can be applied across the gate electrode 4 and the source electrode 8, and a higher margin for applying the gate voltage can be obtained even if the MESFET has a greater dispersion in threshold voltage than conventional MESFETs without buffer layer 10. Thereby a large scale integrated circuit having the MESFET can be obtained. For example, in a 4 kbits static RAM consisted of DCFLs including the GaAs MESFETs with a Schottky barrier height of 0.7 V, it is thought that there is less dispersion in threshold voltage (of normally off type FET) than 30 mV may be required in order to obtain complete memory operation. If the 4 kbits static RAM consists of GaAs MESFETs with a Schottky barrier height of 1.1 V, less dispersion of the threshold voltage of normally off type FET is required than 50 mV in order to a enable complete memory operation. Therefore, the wider range of dispersion in threshold voltage can be obtained than the conventional DCFL having the MESFET without the buffer layer 10.

In the second preferred embodiment of the MESFET, the $Al_xGa_{(1-x)}As$ buffer layer 10 is formed above the active layer 3 by replacing Al with Ga, the remaining Ga can operate as acceptor, the carrier density on the upper surface of the active layer 3 may be less than the conventional MESFET without the buffer layer 3. Thereby the Schottky characteristic may be improved resulting in the improvement of the MESFET.

What is claimed is:

1. A method for producing a metal semiconductor field effect transistor comprising the steps of:

depositing a film layer of silicon nitride with a thickness of approximately 1000 Å on the upper surface of a semiconductor substrate of GaAs;

forming a first mask pattern wherein the mask is made of a material selected from the group consisting of $SiO_2$, Ti, W, Mo, or Ni on one portion of the upper surface of the film layer of silicon nitride;

forming a first layer which will be a buffer layer of $Al_xGa_{(1-x)}As$ in a predetermined region of the semiconductor substrate using said first mask pattern by selective Al ion implantation at a dose of $8 \times 10^{16}$ cm$^{-2}$ and an acceleration energy of 30 keV;

forming a second layer which will become an active layer of GaAs in a predetermined region of the semiconductor substrate using said first mask pattern by selective ion implantation at a dose of $8 \times 10^{12}$ cm$^{-2}$ and an acceleration energy of 60 keV;

removing said first mask pattern;

removing said film layer of silicon nitride, forming a metal gate electrode on the upper surface of the semiconductor substrate, the metal being of a material which when connected to GaAs forms a Schottky contact, forming a second mask pattern wherein the mask is made of a material selected from the group consisting of $SiO_2$, Ti, W, Mo, or Ni on one portion of the upper surface of a semiconductor substrate of GaAs;

forming regions of high impurity concentration regions in predetermined regions at both sides of said gate electrode in the semiconductor substrate using said second mask pattern by ion implantation at a dose of $4 \times 10^{13}$ cm$^{-2}$ and an acceleration energy of 150 keV;

removing the second mask pattern;

annealing the semiconductor substrate comprising said first and second layers and said regions in $N_2$ gas at 800° C. for 20 minutes, wherein said first and said second layers become a buffer layer of $Al_xGa_{(1-x)}As$ and an active layer of GaAs, respectively, and said regions become high impurity concentration regions; and forming a source electrode and a drain electrode on the upper surface of said high impurity concentration regions, respectively, whereby said buffer layer of $Al_xGa_{(1-x)}As$ is formed above the active layer of GaAs.

2. The method as in claim 1, wherein x is in the range of 0.2 to 0.5.

3. The method as in claim 1, wherein x is 0.3.

* * * * *